United States Patent
Harada et al.

(10) Patent No.: US 9,761,628 B2
(45) Date of Patent: Sep. 12, 2017

(54) IMAGING ELEMENT AND IMAGING DEVICE

(71) Applicant: SONY CORPORATION, Tokyo (JP)

(72) Inventors: Kouichi Harada, Kanagawa (JP); Kyoko Izuha, Kanagawa (JP); Koji Kadono, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/036,104

(22) PCT Filed: Oct. 16, 2014

(86) PCT No.: PCT/JP2014/077502
§ 371 (c)(1),
(2) Date: May 12, 2016

(87) PCT Pub. No.: WO2015/087611
PCT Pub. Date: Jun. 18, 2015

(65) Prior Publication Data
US 2016/0300879 A1    Oct. 13, 2016

(30) Foreign Application Priority Data

Dec. 13, 2013  (JP) .................................. 2013-257589

(51) Int. Cl.
*H01L 21/00* (2006.01)
*H01L 27/146* (2006.01)
*H01L 31/10* (2006.01)

(52) U.S. Cl.
CPC .... *H01L 27/14647* (2013.01); *H01L 27/1462* (2013.01); *H01L 27/1464* (2013.01);
(Continued)

(58) Field of Classification Search
CPC ......... H01L 27/14647; H01L 27/14694; H01L 27/14621
See application file for complete search history.

(56) References Cited

U.S. PATENT DOCUMENTS

2012/0025061 A1* 2/2012 Izuha ................... H04N 5/3698
                                                         250/208.1
2012/0060907 A1    3/2012 Schoenfeld et al.

FOREIGN PATENT DOCUMENTS

JP          6-61467 A    3/1994
JP          9-213923 A   8/1997
(Continued)

OTHER PUBLICATIONS

International Search Report received for PCT Application No. PCT/JP2014/077502, mailed on Dec. 22, 2014, 2 pages.
(Continued)

*Primary Examiner* — Laura Menz
(74) *Attorney, Agent, or Firm* — Chip Law Group (57) ABSTRACT

Provided is an imaging element including: a light receiving element 20; and a stacked structure body 130 that is placed on a light incident side of the light receiving element 20 and in which a semiconductor layer 131 and a nanocarbon film 132 to which a prescribed electric potential is applied are stacked from the light receiving element side. The semiconductor layer 131 is made of a wide gap semiconductor with an electron affinity of 3.5 eV or more, or is made of a semiconductor with a band gap of 2.0 eV or more and an electron affinity of 3.5 eV or more.

13 Claims, 6 Drawing Sheets

(52) U.S. Cl.
CPC .. *H01L 27/14621* (2013.01); *H01L 27/14625* (2013.01); *H01L 27/14627* (2013.01); *H01L 27/14685* (2013.01); *H01L 27/14692* (2013.01); *H01L 27/14694* (2013.01); *H01L 27/14696* (2013.01); *H01L 27/14698* (2013.01); *H01L 31/10* (2013.01)

(56) References Cited

FOREIGN PATENT DOCUMENTS

| | | |
|---|---|---|
| JP | 2007-273939 A | 10/2007 |
| JP | 2010-103457 A | 5/2010 |
| JP | 2012-160612 A | 8/2012 |
| JP | 2012-216760 A | 11/2012 |

OTHER PUBLICATIONS

Written Opinion received for PCT Application No. PCT/JP2014/077502, mailed on Dec. 22, 2014, 6 pages.
International Preliminary Report received for PCT Application No. PCT/JP2014/077502, issuance on Jun. 14, 2016, 6 pages.

* cited by examiner

| $B_0$ | $IR_1$ | $B_0$ | $IR_1$ |
|---|---|---|---|
| $G_0$ | $R_0$ | $G_0$ | $R_0$ |
| $B_0$ | $IR_1$ | $B_0$ | $IR_1$ |
| $G_0$ | $R_0$ | $G_0$ | $R_0$ |

IMAGING ELEMENT AND IMAGING DEVICE

CROSS REFERENCE TO RELATED APPLICATIONS

This application is a U.S. National Phase of International Patent Application No. PCT/JP 20114/077502 filed on Oct. 16, 2014, which claims priority benefit of Japanese Patent Application No. JP 2013-257589filed in the Japan Patent Office on Dec. 13, 2013. Each of the above-referenced applications is hereby incorporated herein by reference in its entirety.

TECHNICAL FIELD

The present disclosure relates to an imaging element and an imaging device including the imaging element.

BACKGROUND ART

An imaging element included in an imaging device generally includes a light receiving element (a photoelectric conversion element, or a photodiode) formed in a silicon semiconductor substrate. When the wavelength of incident light is determined, the light absorption coefficient of silicon (Si) is determined uniquely. Therefore, in order to cause light, in particular light in the region from red to near-infrared, to be absorbed in the silicon semiconductor substrate with good efficiency, it is necessary to form the light receiving element in an area of the silicon semiconductor substrate located deep (specifically, for example, approximately 10 µm deep) from the light incident surface (e.g. see JP H9-331058A). This means that, when the pixel in the imaging device is miniaturized, the aspect ratio in the imaging element is increased.

CITATION LIST

Patent Literature

Patent Literature 1: JP H9-331058A
Patent Literature 2: JP 2012-216760A

SUMMARY OF INVENTION

Technical Problem

However, when the aspect ratio is increased in the imaging element, color mixing between pixels in which the light incident on an imaging element adjacent to an imaging element enters the latter imaging element becomes a problem. When the aspect ratio in the imaging element is reduced in order to reduce the color mixing between pixels, there is a problem that the sensitivity of the imaging element in the region from red to near-infrared is reduced. Furthermore, since the energy band gap of Si is 1.1 eV, it is theoretically impossible to detect infrared light with wavelengths longer than 1.1 µm. Although a technology in which graphene is used as a transparent electrode is known from, for example, JP 2012-216760A, a technology in which graphene is used as part of the photoelectric conversion means in the imaging element is not known as far as the present inventors have searched.

Thus, an object of the present disclosure is to provide an imaging element that allows the pixel to be miniaturized and at the same time has high sensitivity in the region from visible light to infrared light, and an imaging device including the imaging element.

Solution to Problem

In order to achieve the above object, according to the present disclosure, there is provided an imaging element including: a light receiving element (photoelectric conversion element); and a stacked structure body that is placed on a light incident side of the light receiving element and in which a semiconductor layer and a nanocarbon film to which a prescribed electric potential is applied are stacked from the light receiving element side. The semiconductor layer is made of a wide gap semiconductor with an electron affinity of 3.5 eV or more, or is made of a semiconductor with a band gap of 2.0 eV or more and an electron affinity of 3.5 eV or more.

In order to achieve the above object, according to the present disclosure, there is provided an imaging device including imaging elements arranged in a two-dimensional matrix configuration and each including a light receiving element, At least part of the imaging elements arranged in a two-dimensional matrix configuration include a stacked structure body that is placed on a light incident side of the light receiving element and in which a semiconductor layer and a nanocarbon film to which a prescribed electric potential is applied are stacked from the light receiving element side. The semiconductor layer is made of a wide gap semiconductor with an electron affinity of 3.5 eV or more, or is made of a semiconductor with a band gap of 2.0 eV or more and an electron affinity of 3.5 eV or more.

Advantageous Effects of Invention

In the imaging element and the imaging device of the present disclosure, an imaging element and an imaging device having high sensitivity in the region from red to infrared or the region from ultraviolet light to X-rays while keeping the visible light sensitivity of conventional imaging elements and imaging devices or while increasing the visible light sensitivity can be obtained. The effects described in this specification are only examples and are not limitative ones, and there may be additional effects.

DESCRIPTION OF EMBODIMENTS

Hereinbelow, the present disclosure is described based on Examples with reference to the drawings, but the present disclosure is not limited to Examples, and the various numerical values and materials in Examples are only examples. The description is given in the following order.
1. Overall description of the imaging element and the imaging device of the present disclosure
2. Example 1 (imaging elements of the present disclosure)
3. Example 2 (a modification of Example 1)
4. Example 3 (another modification of Example 1)
5. Example 4 (an imaging device of the present disclosure), etc.

Overall Description of the Imaging Element and the Imaging Device of the Present Disclosure The imaging element of the present disclosure and at least part of the imaging elements included in the imaging device of the present disclosure may be hereinafter collectively referred to as "the imaging element etc. of the present disclosure." In the imaging element etc. of the present disclosure, a form in which the prescribed electric potential is a negative potential with respect to a reference potential point of the light receiving element (specifically, for example, the ground potential of the light receiving element) is possible. By applying the prescribed electric potential to the nanocarbon film, an electric field is formed between the nanocarbon film and the light receiving element, and electrons generated in the nanocarbon film go toward the light receiving element with good efficiency and reach the light receiving element.

In the imaging element etc. of the present disclosure including the preferred form mentioned above, a form in which the wide gap semiconductor that forms the semiconductor layer is a semiconductor selected from the group consisting of silicon carbide (SiC), cadmium sulfide (CdS), indium oxide ($In_2O_3$), tin oxide ($SnO_2$), zinc oxide (ZnO), titanium oxide ($TiO_2$), copper oxide ($Cu_2O$), indium nitride (InN), gallium nitride (GaN), tungsten oxide ($WO_3$), gallium phosphide (GaP), magnesium oxide (MgO), tantalum oxide ($Ta_2O_5$), and the like is possible.

In the imaging element etc. of the present disclosure including the various preferred forms described above, a form in which the nanocarbon film is formed of graphene is possible, but the form is not limited to this, and also a form of being formed of carbon nanotubes or a fullerene is possible. Since the thickness of graphene is the thickness of one layer of atoms, by forming the nanocarbon film out of graphene, a reduction in the height (thickness) of the imaging element or the imaging device can be achieved and also the aspect ratio of the imaging element can be reduced.

In the imaging element etc. of the present disclosure including the various preferred forms described above, a form in which the light receiving element is formed in a semiconductor substrate and a tunnel insulating film (specifically, for example, a $SiO_2$ film) is formed on a surface of the semiconductor substrate in contact with the stacked structure body is possible; thereby, the surface level density of the surface of the semiconductor substrate can be reduced and consequently the dark current can be reduced.

In the imaging element etc. of the present disclosure including the various preferred forms described above, a configuration in which the stacked structure body is formed of one semiconductor layer and one or a plurality of nanocarbon films, and a prescribed electric potential is applied to the outermost nanocarbon film is possible, or a configuration in which the stacked structure body is formed of one semiconductor layer, a plurality of nanocarbon films of which at least one is doped with an impurity of a first conductivity type (for example, the n-type), and a plurality of nanocarbon films of which at least one is doped with an impurity of a second conductivity type (for example, the p-type) different from the first conductivity type, and a prescribed electric potential is applied to the outermost nanocarbon film is possible. A p-n junction can be formed by doping the nanocarbon film with impurities of the first conductivity type (for example, the n-type) and the second conductivity type (for example, the p-type). In these configurations, a configuration in which the electron affinity of the wide gap semiconductor with an electron affinity of 3.5 eV or more which forms the semiconductor layer or of the semiconductor with a band gap of 2.0 eV or more and an electron affinity of 3.5 eV or more which forms the semiconductor layer is 4.5 eV or less is preferable.

In the imaging element etc. of the present disclosure including the various preferred forms described above, a configuration in which the stacked structure body is formed by a plurality of semiconductor layers and a plurality of nanocarbon films being alternately stacked, and a prescribed electric potential is applied to the outermost nanocarbon film is possible; in this case, a configuration in which the electron affinity of the wide gap semiconductor with an electron affinity of 3.5 eV or more which forms the semiconductor layer or of the semiconductor with a band gap of 2.0 eV or more and an electron affinity of 3.5 eV or more which forms the semiconductor layer is 4.5 eV or less is preferable. Part of the plurality of nanocarbon films may be doped with an impurity of the first conductivity type (for example, the n-type), or may be doped with an impurity of the second conductivity type (for example, the p-type) different from the first conductivity type, and a p-n junction can be formed by the nanocarbon films doped with impurities.

In the imaging element etc. of the present disclosure including the various preferred forms and configurations described above, the imaging element may be configured as a back-side illumination imaging element, or may be configured as a front-side illumination imaging element. Here, in the former case, a form in which the light receiving element is formed in a semiconductor substrate and a hole storage layer is formed in a surface area of the semiconductor substrate in contact with the stacked structure body is possible.

In the imaging element etc. of the present disclosure including the various preferred forms and configurations described above, a form in which the semiconductor substrate is formed of a silicon semiconductor substrate is possible.

In the imaging element etc. of the present disclosure including the various preferred forms and configurations described above, a wiring is connected to the nanocarbon film to which a prescribed electric potential is applied. A form in which the nanocarbon film to which a prescribed electric potential is applied is common to imaging elements is possible. Also a form in which the nanocarbon film to which a prescribed electric potential is applied is formed in the entire imaging device (that is, a form in which the nanocarbon film to which a prescribed electric potential is applied is formed as what is called a solid film) is possible. By the above forms, the wiring structure can be simplified. Also a form in which the stacked structure body is common to the entire imaging device (that is, a form in which the stacked structure body is formed as what is called a solid film) is possible. Also a form in which the nanocarbon film is formed only in the pixel of a specific color, for example, only in the white imaging element in a configuration of red imaging elements, green imaging elements, blue imaging elements, and white imaging elements is possible.

As the light receiving element, specifically a photosensor (photodiode) may be given; and a CMOS image sensor or a CCD image sensor is formed by using the light receiving element. The light receiving element, the imaging element or the imaging device itself may be a light receiving element, an imaging element or an imaging device of a known configuration and a known structure.

Chemical doping may be performed in order to dope the nanocarbon film with an impurity of the first conductivity type or the second conductivity type, for example. To perform chemical doping, specifically, a dopant layer may be formed on the nanocarbon film. The dopant layer may be an electron-accepting (p-type) dopant layer, or may be an electron-donating (n-type) dopant layer. As the material that forms the electron-accepting (p-type) dopant layer, chlorides such as $AuCl_3$, $HAuCl_4$, and $PtCl_4$; acids such as $HNO_3$, $H_2SO_4$, HCl, and nitromethane; group III elements such as boron and aluminum; and electron-withdrawing molecules such as oxygen may be given; and as the material that forms the electron-donating (n-type) dopant layer, in addition to group V elements such as nitrogen and phosphorus, pyridine-based compounds, nitrides, alkali metals, and electron-donating molecules such as aromatic compounds having an alkyl group may be given.

The nanocarbon film may be formed of graphene as described above; graphene refers to a sheet-like substance of $sp^2$-bonded carbon atoms with the thickness of one atom, and has a hexagonal lattice structure like a honeycomb composed of carbon atoms and the bonds between them. As advantages of using graphene of such characteristics for electronic devices such as imaging elements, and imaging devices, the following can be given: the film thickness is as small as 0.3 nm.

EXAMPLE 1

Figure 1:
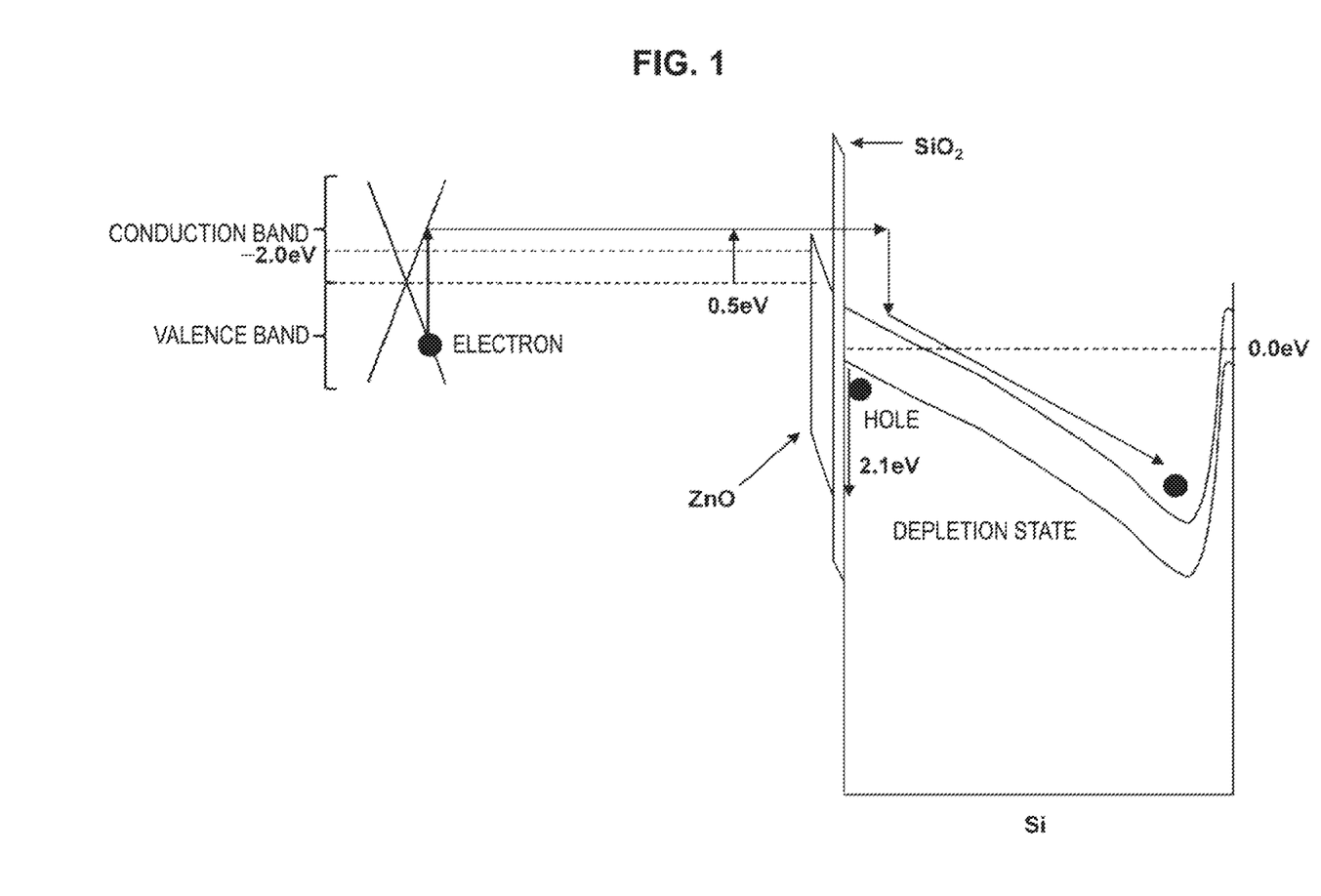
FIG. 1 is a schematic diagram of the band structure in a back-side illumination imaging element of Example 1.
Figure 2:
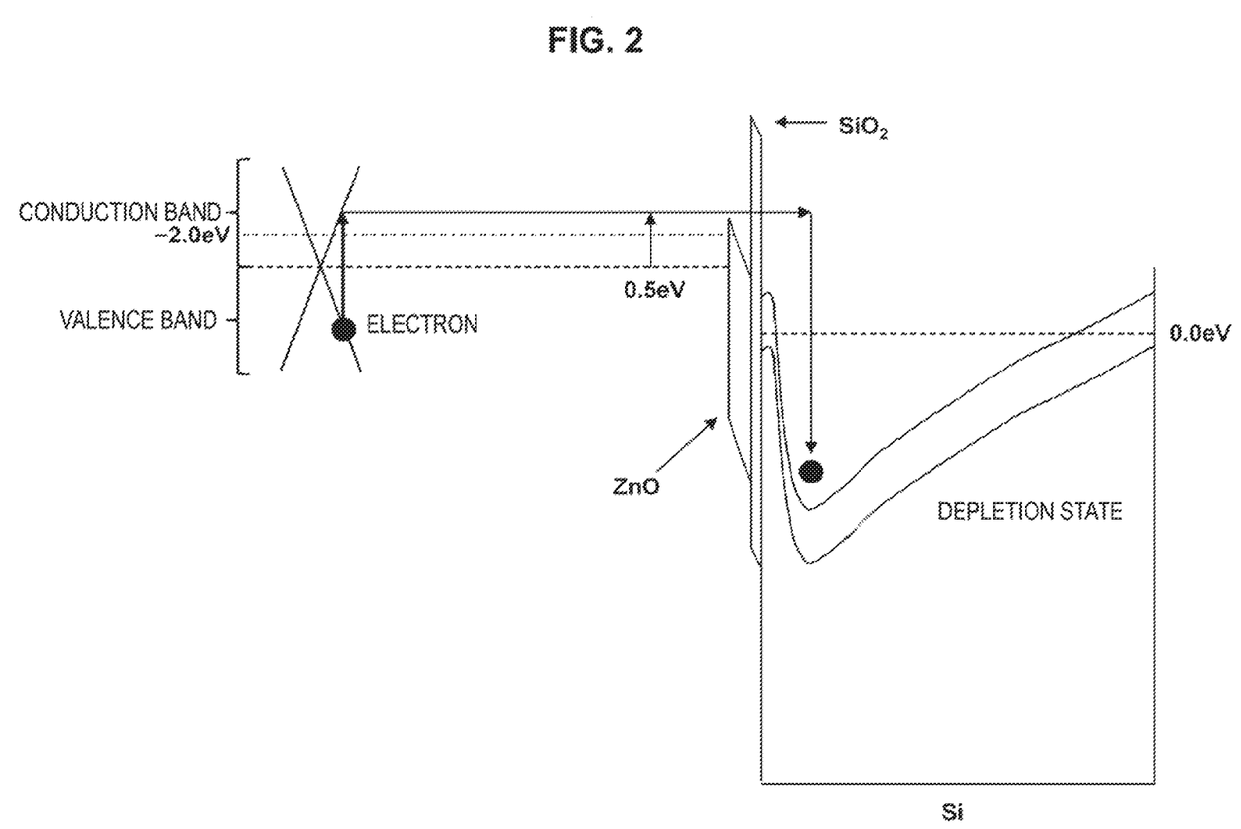
FIG. 2 is a schematic diagram of the band structure of a front-side illumination imaging element of Example 1.
Figure 3:
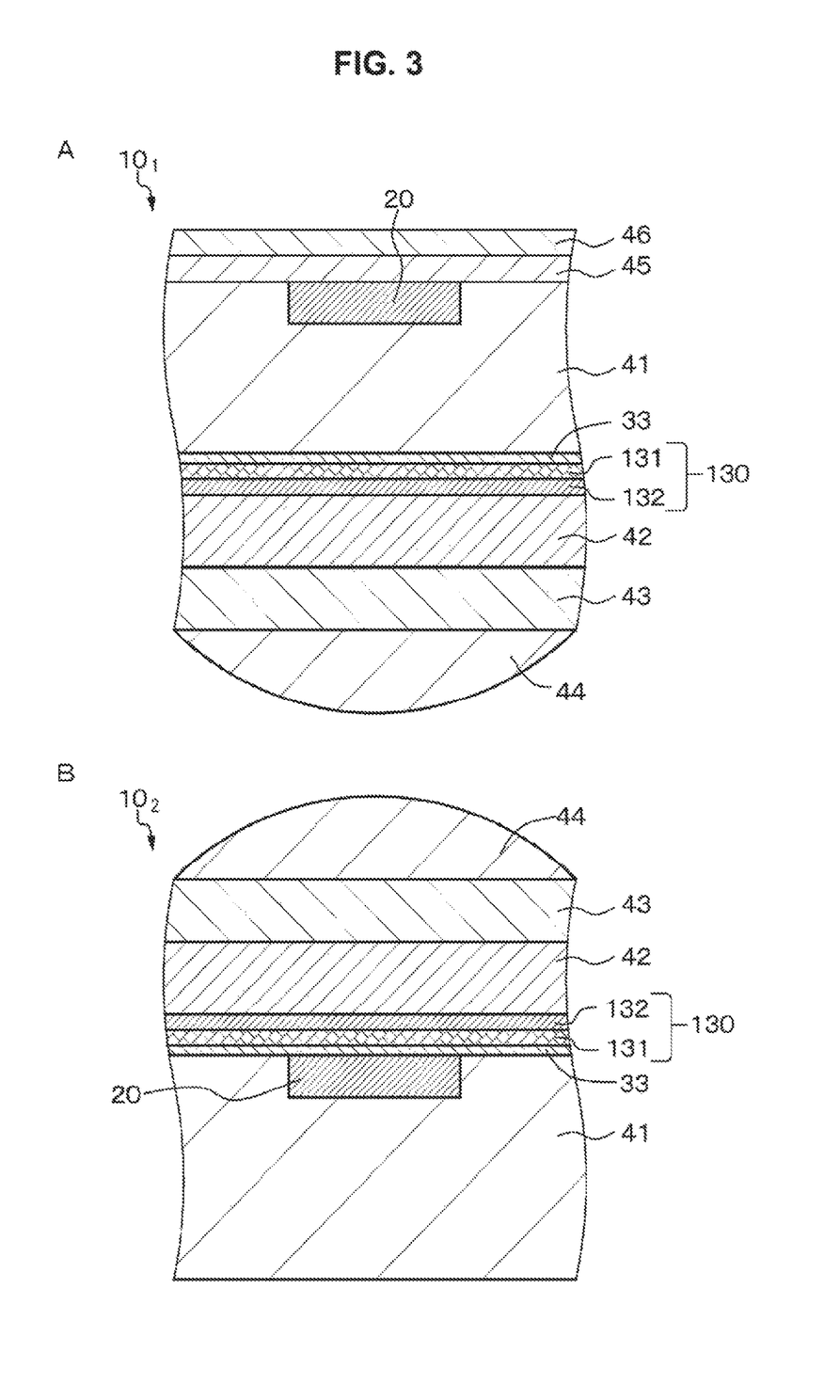
FIG. 3A and FIG. 3B are schematic partial cross-sectional views of imaging elements of Example 1.

Example 1 relates to imaging elements of the present disclosure. Schematic partial cross-sectional views of imaging elements of Example 1 are shown in FIG. 3A and FIG. 3B; the imaging element shown in FIG. 3A is of a back-side illumination type, and the imaging element shown in FIG. 3B is of a front-side illumination type. A schematic diagram of the band structure in the back-side illumination imaging element is shown in FIG. 1, and a schematic diagram of the band structure in the front-side illumination imaging element is shown in FIG. 2.

Imaging elements $10_1$ and $10_2$ of Example 1 include a light receiving element (a photoelectric conversion element, a photosensor, or a photodiode) 20 and a stacked structure body 130 that is placed on the light incident side of the light receiving element 20 and in which a semiconductor layer 131 and a nanocarbon film 132 to which a prescribed electric potential is applied are stacked from the light receiving element side. The semiconductor layer 131 is made of a wide gap semiconductor with an electron affinity of 3.5 eV or more, or is made of a semiconductor with a band gap of 2.0 eV or more and an electron affinity of 3.5 eV or more.

Here, the nanocarbon film 132 is specifically formed of graphene. The light receiving element 20 is formed in a semiconductor substrate 41, and a tunnel insulating film 33, specifically, for example a $SiO_2$ film, which is thin enough for a tunnel current to flow directly, is formed on a surface of the semiconductor substrate 41 in contact with the stacked structure body 130. However, the formation of the tunnel insulating film 33 is not essential.

More specifically, the imaging elements $10_1$ and $10_2$ have a structure in which the silicon semiconductor substrate 41, the stacked structure body 130, a protection film 42 made of, for example, SiN, a transparent film (or a color filter layer) 43, and a condensing lens (on-chip lens) 44 are stacked. The light receiving element 20 is formed in a surface portion of the silicon semiconductor substrate 41. In the back-side illumination imaging element $10_1$, the stacked structure body 130 etc. are formed on the back surface side of the silicon semiconductor substrate 41; and in the front-side illumination imaging element $10_2$, the stacked structure body 130 etc. are formed on the front surface side of the silicon semiconductor substrate 41. In the back-side illumination imaging element $10_1$, an interlayer insulating layer 45 and a protection layer 46 made of $SiO_2$ are formed on the front surface side of the silicon semiconductor substrate 41. A signal charge is generated by incident light being photoelectrically converted in the light receiving element 20, and the signal charge is stored in the light receiving element 20.

Figure 4:
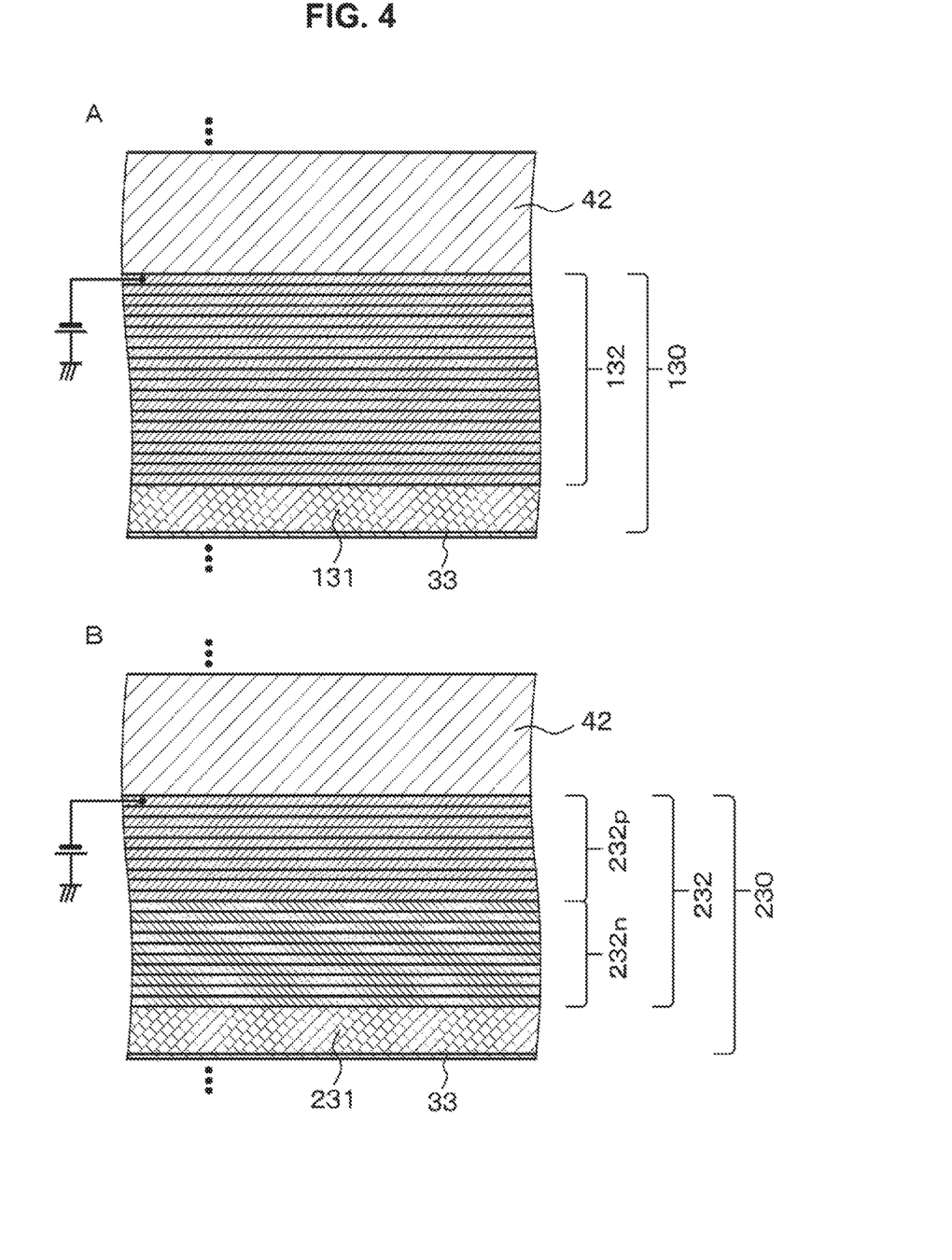
FIG. 4A and FIG. 4B are enlarged schematic partial cross-sectional views of stacked structure bodies in imaging elements in Example 1 and Example 2, respectively.

In Example 1, zinc oxide (ZnO) is used as the wide gap semiconductor that forms the semiconductor layer 131. The electron affinity of zinc oxide is approximately 4.1 eV. The electron affinity of graphene is approximately 4.6 eV, and the difference between the electron affinity of graphene and the electron affinity of zinc oxide is 0.5 eV. In the imaging elements $10_1$ and $10_2$ of Example 1, as shown in FIG. 4A, which is an enlarged schematic partial cross-sectional view of the stacked structure body 130, the stacked structure body 130 is formed of one semiconductor layer 131 and one or a plurality of (in the illustrated example, 20) non-doped nanocarbon films 132, and a prescribed electric potential is applied to the outermost nanocarbon film. Here, the prescribed electric potential is a negative potential with respect to a reference potential point of the light receiving element 20 (specifically, the ground potential of the light receiving element 20), more specifically, for example 2.0 volts. Since an electric field is formed between the nanocarbon film 132 and the light receiving element 20 by applying such a negative potential to the nanocarbon film and the thickness of the nanocarbon film 132 is small, electrons generated in the nanocarbon film 132 go toward the light receiving element 20 with good efficiency without recombination, and reach the light receiving element 20; consequently, high quantum efficiency can be achieved. Here, the nanocarbon film absorbs 2.3% of the light per layer. Therefore, for example, when 20 nanocarbon films are stacked, the light transmittance of the 20 nanocarbon films is approximately 63%. That is, approximately 63% of the light that has reached the nanocarbon films 132 passes through the nanocarbon films 132 and goes toward the light receiving element 20. On the other hand, approximately 37% of the light that has reached the nanocarbon films 132 is absorbed in the nanocarbon films 132. Photoelectric conversion occurs in the nanocarbon films 132 on the basis of the light absorbed in the nanocarbon films 132. The light receiving element 20 stores the signal charge generated by the photoelectric conversion of the light that has passed through the nanocarbon films 132 and at the same time stores electrons generated on the basis of the photoelectric conversion in the nanocarbon films 132. Here, graphene has no dependence on the wavelength of light in photoelectric conversion. That is, theoretically photoelectric conversion can occur in graphene when light of any wavelength enters.

A wiring (not shown) is connected to the nanocarbon film 132 to which a prescribed electric potential is applied. The configuration and structure of the back-side illumination imaging element $10_1$ and the front-side illumination imaging element $10_2$ may be a known configuration and structure except for the stacked structure body 130, and a detailed description is omitted. Also the imaging device itself described later may be a similar configuration to a known imaging device, and also the method for driving the imaging element and the method for driving the imaging device may be a known driving method, and a detailed description is omitted.

As shown in FIG. 1, which is a schematic diagram of the band structure in the back-side illumination imaging element of Example 1, and FIG. 2, which is a schematic diagram of the band structure in the front-side illumination imaging element of Example 1, a barrier of 0.5 eV is formed by bringing graphene with an electron affinity of approximately 4.6 eV and zinc oxide with an electron affinity of approximately 4.1 eV into contact. In this case, of the electrons that have been photoelectrically converted in the graphene and can surmount the barrier, electrons with the minimum energy are the electron shown by the circle mark in FIG. 1 and FIG. 2, and the wavelength of the light absorbed at this time is approximately 1.2 μm. Since the dark current generated in the nanocarbon film 132 cannot surmount the barrier, the electrons injected into the light receiving element side are electrons excited by light; thus, low dark current can be achieved.

There is a relationship of $$E = 1.240/\lambda \quad (1)$$

between the energy (E; unit: eV) and the wavelength (λ; unit: μm) of a photon. That is, in the imaging element of Example 1, an imaging element having sensitivity in the range from visible light to near-infrared light with a wavelength 1.2 μm can be obtained. To what extent of wavelength of infrared light the imaging element of Example 1 has sensitivity in the range from visible light depends on the value of the electron affinity of the wide gap semiconductor that forms the semiconductor layer. That is, when a wide gap semiconductor with a larger value of electron affinity is used, the value of the barrier formed by the contact of the nanocarbon film 132 and the semiconductor layer 131 is smaller, and consequently the value of the left-side hand of Formula (1) above is smaller and accordingly the value of the wavelength λ is larger. That is, light in an infrared region of longer wavelengths can be detected with high sensitivity. For example, when a wide gap semiconductor with a value of electron affinity of approximately 4.5 eV (for example, $TiO_2$ or $WO_3$) is used, light in the wavelength region from visible light to approximately 6.2 μm can be detected with a high sensitivity of a quantum efficiency of approximately 30% by, for example, cooling the imaging element with liquid nitrogen to suppress the dark current.

In the back-side illumination imaging element of Example 1, since a barrier of approximately 2.1 eV to holes is formed from the light receiving element 20 toward the semiconductor layer 131, a prescribed electric potential (specifically, −2.0 volts) can be applied to the nanocarbon film 132 without a hole current flowing. Consequently, a hole accumulation layer is formed in a surface area of the semiconductor substrate 41 in contact with the stacked structure body 130, and a structure equivalent to a hole-accumulation diode (HAD) sensor structure can be obtained; thus, a reduction in dark current can be achieved.

Figure 6:
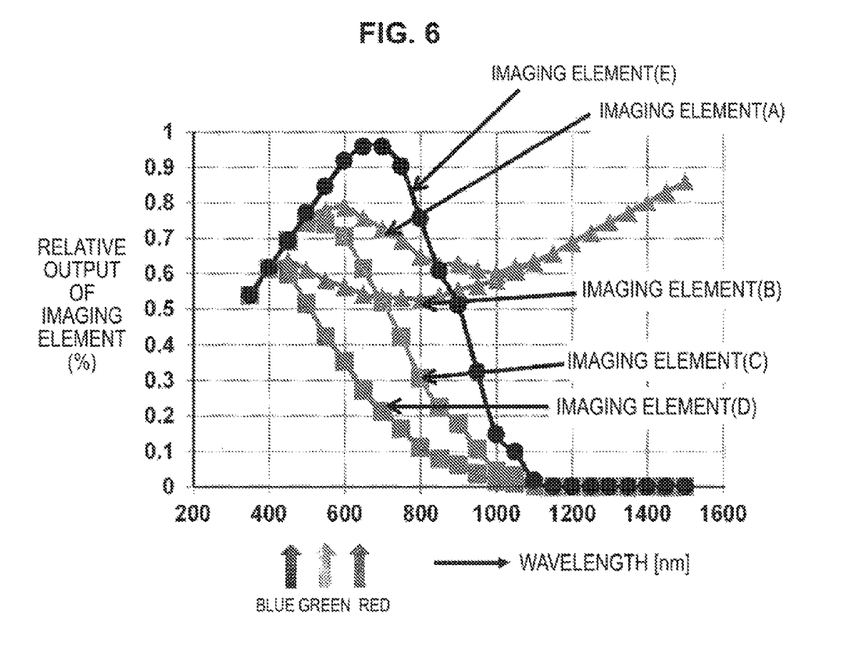
FIG. 6 is a graph showing the results of comparison and calculation of the relative spectral sensitivity of an imaging element etc. of Example 1.

Graphene absorbs 2.3% of the light per layer without depending on the wavelength. That is, by stacking 20 layers of graphene, approximately 37% of the light is absorbed without depending on the wavelength, as described above. Here, the relative spectral sensitivities in the following were compared and calculated, where the thickness of a portion of the silicon semiconductor substrate through which light passes from when it is incident on the silicon semiconductor substrate to when it reaches the light receiving element is referred to as a "sensor thickness":

(a) an imaging element (A) including a stacked structure body in which 20 layers of graphene are stacked and having a sensor thickness of 3 μm, (b) an imaging element (B) including a stacked structure body in which 20 layers of graphene are stacked and having a sensor thickness of 1 μm, (c) an imaging element (C) not including a stacked structure body and having a sensor thickness of 3 μm, (d) an imaging element (D) not including a stacked structure body and having a sensor thickness of 1 μm, and (e) an imaging element (E) not including a stacked structure body and having a sensor thickness of 10 μm, and the results are shown in FIG. 6. The imaging elements were configured as an imaging element by which a white/black (monochrome) image is obtained. The relative outputs (unit: %) of the imaging elements are shown in FIG. 6; the relative output is one normalized by the peak sensitivity of the imaging element (E).

It is found that, in the imaging elements of Example 1 [the imaging element (A) and the imaging element (B)], a sufficient sensitivity is obtained even to near-infrared light with a wavelength of 1.2 μm, where there is no sensitivity in conventional imaging elements, without a reduction in visible light sensitivity with respect to the conventional imaging elements [the imaging element (C) and the imaging element (D)]. In the imaging element (B) in which the sensor thickness is set to 1 μm, the sensitivity to red light is improved to approximately twice that of the imaging element (D), and an improvement in the optical color mixing between submicron pixels and an improvement in sensitivity are expected. Although the number of stacked layers of graphene is set to 20 in these Examples, further improvement in sensitivity is expected by further increasing the number of stacked layers.

Graphene can be formed by the manufacturing method described below, for example. That is, a film containing a graphene-izing catalyst is formed as a film on a base. Then, a gas-phase carbon supply source is supplied to the film containing a graphene-izing catalyst, and at the same time the gas-phase carbon supply source is heat-treated; thereby, graphene is produced. After that, the graphene is cooled at a prescribed cooling rate; thus, graphene in a film form can be formed on the film containing a graphene-izing catalyst. As the graphene-izing catalyst, as well as carbon compounds such as SiC, at least one metal selected from Ni, Co, Fe, Pt, Au, Al, Cr, Cu, Mg, Mn, Mo, Rh, Si, Ta, Ti, W, U, V, and Zr may be given. As the gas-phase carbon supply source, for example, at least one carbon source selected from carbon monoxide, methane, ethane, ethylene, ethanol, acetylene, propane, butane, butadiene, pentane, a pentene, cyclopentadiene, hexane, cyclohexane, benzene, and toluene may be given. The graphene in a film form thus formed is separated from the film containing a graphene-izing catalyst; thus, graphene can be obtained.

Specifically, for example, rolled copper foil with a thickness of 35 μm is heated to 1000° C. in a hydrogen atmosphere (hydrogen flow rate: 20 sccm) in an electric furnace, and methane gas is supplied for 30 minutes at a flow rate of 30 sccm; thereby, graphene is formed on the copper foil. Then, an acetone-diluted solution of polymethyl methacrylate (PMMA) is applied onto the graphene by spin coating, and then the solution is dried to form a PMMA film. After that, the copper foil is removed using an iron nitrate aqueous solution, the graphene stuck to the PMMA film is transferred onto a semiconductor layer, and then the PMMA film is removed using an acetone solvent. Thus, a stacked structure body of a nanocarbon film made of graphene and a semiconductor layer can be obtained. By repeating the above method, nanocarbon films made of graphene can be stacked. In each film formation process, also a method based on the roll-to-roll method in which film formation is performed continuously, a method in which an electrode is heated locally and graphene is formed as a film continuously, or the like can be employed, for example. This applies also to the following description.

In the imaging element of Example 1, an imaging element with high sensitivity in the region from red to near-infrared can be obtained while the visible light sensitivity of conventional imaging elements is kept or while the visible light sensitivity is increased. Furthermore, since the reduction in the sensitivity to red color when the thickness of the imaging element is reduced (specifically, when the silicon semiconductor substrate in the back-side illumination imaging element is made a thin film) can be improved, an imaging element with limited color mixing between pixels can be obtained even when the pixel is miniaturized. Furthermore, when a semiconductor having an appropriate electron affinity and band gap is selected as the semiconductor that forms the semiconductor layer, imaging with high sensitivity up to infrared light of approximately 6 µm becomes possible by cooling with liquid nitrogen or the like. In the case of the backside illumination imaging element, even when a $p^+$ layer cannot be formed on the side of an interface of the silicon semiconductor substrate in contact with the stacked structure body, an inversion layer is formed near this interface of the silicon semiconductor substrate by applying a negative voltage to the nanocarbon film; thus, low dark current can be achieved.

EXAMPLE 2

Example 2 is a modification of Example 1. As shown in FIG. 4B, which is an enlarged schematic partial cross-sectional view of a stacked structure body 230 in an imaging element of Example 2, in the imaging element of Example 2, the stacked structure body 230 is formed of one semiconductor layer 231, a plurality of (in the illustrated example, 10) nanocarbon films 232n doped with an n-type impurity, and a plurality of (in the illustrated example, 10) nanocarbon films 232p doped with a p-type impurity, and a prescribed electric potential is applied to the outermost nanocarbon film. By employing such a configuration, an electric field can be formed also in the stacked structure body 230, and the proportion of recombination is reduced and in accordance with this the quantum efficiency of photoelectric conversion can be improved still further. Also in Example 2, the electron affinity of the wide gap semiconductor with an electron affinity of 3.5 eV or more or the semiconductor with a band gap of 2.0 eV or more and an electron affinity of 3.5 eV or more which forms the semiconductor layer is 4.5 eV or less. Otherwise, the configuration and structure of the imaging element of Example 2 may be similar to the configuration and structure of the imaging element of Example 1, and a detailed description is omitted.

For the stacked structure body of Example 2, specifically, rolled copper foil with a thickness of 35 µm is heated to 1000° C. in a hydrogen atmosphere (hydrogen flow rate: 20 sccm) in an electric furnace, and methane gas is supplied for 30 minutes at a flow rate of 30 sccm; thereby, graphene is formed on the copper foil, for example. Subsequently, a dopant layer is formed on the graphene, then an acetone-diluted solution of polymethyl methacrylate (PMMA) is applied onto the dopant layer by spin coating, and subsequently the solution is dried to form a PMMA film. After that, the copper foil is removed using an iron nitrate aqueous solution, the graphene stuck to the PMMA film is transferred onto a semiconductor layer or the like, and then the PMMA film is removed using an acetone solvent. Thus, a stacked structure body of a nanocarbon film made of graphene and doped with an impurity and a semiconductor layer can be obtained. By repeating the above method, nanocarbon films made of graphene and doped with an impurity can be stacked.

EXAMPLE 3

Figure 5:
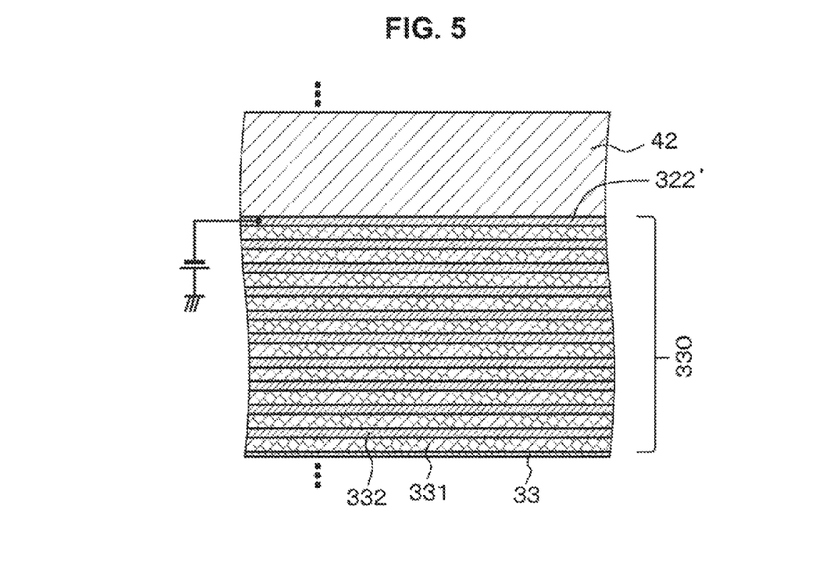
FIG. 5 is an enlarged schematic partial cross-sectional view of a stacked structure body in an imaging element of Example 3.

Also Example 3 is a modification of Example 1. As shown in FIG. 5, which is an enlarged schematic partial cross-sectional view of a stacked structure body 330 in an imaging element of Example 3, in the imaging element of Example 3, the stacked structure body 330 is formed by a plurality of (in the illustrated example, 10) semiconductor layers 331 and a plurality of (in the illustrated example, 10) nanocarbon films 332 being alternately stacked, and a prescribed electric potential is applied to the outermost nanocarbon film 332'. Here, the electron affinity of the wide gap semiconductor with an electron affinity of 3.5 eV or more which forms the semiconductor layer 331 or of the semiconductor with a band gap of 2.0 eV or more and an electron affinity of 3.5 eV or more which forms the semiconductor layer 331 is 4.5 eV or less. Otherwise, the configuration and structure of the imaging element of Example 3 may be similar to the configuration and structure of the imaging element of Example 1, and a detailed description is omitted.

EXAMPLE 4

Example 4 relates to an imaging device of the present disclosure. The imaging device of Example 4 includes imaging elements arranged in a two-dimensional matrix configuration and each including a light receiving element. At least part of the imaging elements arranged in a two-dimensional matrix configuration are formed of the imaging element described in Example 1 to Example 3 (in the following description, referred to as "the imaging element of Example 1 etc."). The stacked structure bodies 130, 230, and 330 are formed without being patterned in the region where the imaging elements of the imaging device are to be formed. That is, the stacked structure bodies 130, 230, and 330 are formed in a solid film state over the entire surface of the region where the imaging elements of the imaging device are to be formed.

For example, when all the imaging elements arranged in a two-dimensional matrix configuration are formed of the imaging element of Example 1 etc., an imaging device including imaging elements having sensitivity in the range from visible light to near-infrared light with a wavelength of 1.2 µm can be obtained. When, as a pair of juxtaposed two imaging elements, one is formed of the imaging element of Example 1 etc. and the other is formed of the imaging element of Example 1 etc. including an IR cut filter, an imaging device that can capture a white/black (monochrome) image and an image based on near-infrared light can be obtained.

Figure 7:
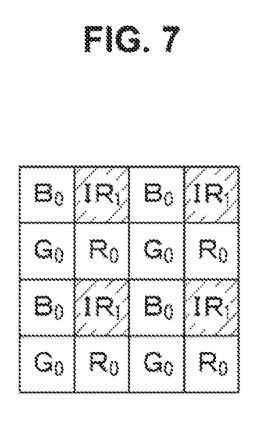
FIG. 7 is a diagram schematically showing a layout of imaging element groups.

As shown in FIG. 7, which is a schematic layout of imaging element groups, also a configuration that includes a red imaging element $R_0$, a green imaging element $G_0$, a blue imaging element $B_0$, and an imaging element $IR_1$ that receives infrared light is possible. A red color filter layer is formed in the red imaging element $R_0$, a green color filter layer is formed in the green imaging element $G_0$, and a blue color filter layer is formed in the blue imaging element $B_0$. In the imaging element $IR_1$, a color filter layer is not formed, and instead a transparent film that allows light in the entire wavelength region to pass through is provided. The transparent film is a film for filling the level difference occurring due to a color filter layer not being formed, and is provided as necessary. The imaging elements $R_0$, $G_0$, $B_0$, and $IR_1$ constitute a unit imaging element group. In FIG. 7, four unit imaging element groups are shown. The nanocarbon film may be included in the red imaging element $R_0$, the green imaging element $G_0$, the blue imaging element $B_0$, and the imaging element $IR_1$, or the nanocarbon film may be included only in the imaging element $IR_1$.

Hereinabove, the present disclosure is described based on preferred Examples, but the present disclosure is not limited to these Examples. The configuration and structure of the imaging element and the imaging device described in Examples are only examples, and may be altered as appropriate. The imaging element and the imaging device described in Examples may be used also for thermography.

Additionally, the present technology may also be configured as below.

[A01] <<Imaging element>> An imaging element including:
a light receiving element; and
a stacked structure body that is placed on a light incident side of the light receiving element and in which a semiconductor layer and a nanocarbon film to which a prescribed electric potential is applied are stacked from the light receiving element side,
wherein the semiconductor layer is made of a wide gap semiconductor with an electron affinity of 3.5 eV or more, or is made of a semiconductor with a band gap of 2.0 eV or more and an electron affinity of 3.5 eV or more.

[A02] The light emitting element according to [A01], wherein the prescribed electric potential is a negative potential with respect to a reference potential point of the light receiving element.

[A03] The imaging element according to [A01] or [A02], wherein the wide gap semiconductor that forms the semiconductor layer is a semiconductor selected from the group consisting of silicon carbide, cadmium sulfide, indium oxide, tin oxide, zinc oxide, titanium oxide, copper oxide, indium nitride, gallium nitride, tungsten oxide, gallium phosphide, magnesium oxide, and tantalum oxide.

[A04] The imaging element according to any one of [A01] to [A03], wherein the nanocarbon film is made of graphene.

[A05] The imaging element according to any one of [A01] to [A04], wherein the light receiving element is formed in a semiconductor substrate, and a tunnel insulating film is formed on a surface of the semiconductor substrate in contact with the stacked structure body.

[A06] The imaging element according to any one of [A01] to [A05], wherein the stacked structure body is formed of one semiconductor layer and one or a plurality of nanocarbon films, and a prescribed electric potential is applied to an outermost nanocarbon film.

[A07] The imaging element according to any one of [A01] to [A05], wherein the stacked structure body is formed of one semiconductor layer, a plurality of nanocarbon films of which at least one is doped with an impurity of a first conductivity type, and a plurality of nanocarbon films of which at least one is doped with an impurity of a second conductivity type different from the first conductivity type, and a prescribed electric potential is applied to an outermost nanocarbon film.

[A08] The imaging element according to [A06] or [A07], wherein an electron affinity of the wide gap semiconductor with an electron affinity of 3.5 eV or more or the semiconductor with a band gap of 2.0 eV or more and an electron affinity of 3.5 eV or more which forms the semiconductor layer is 4.5 eV or less.

[A09] The imaging element according to any one of [A01] to [A05], wherein the stacked structure body is formed by a plurality of semiconductor layers and a plurality of nanocarbon films being alternately stacked, and a prescribed electric potential is applied to an outermost nanocarbon film.

[A10] The imaging element according to [A09], wherein an electron affinity of the wide gap semiconductor with an electron affinity of 3.5 eV or more or the semiconductor with a band gap of 2.0 eV or more and an electron affinity of 3.5 eV or more which forms the semiconductor layer is 4.5 eV or less.

[A11] The imaging element according to any one of [A01] to [A10], wherein
the imaging element is a back-side illumination imaging element,
the light receiving element is formed in a semiconductor substrate, and
a hole accumulation layer is formed in a surface area of the semiconductor substrate in contact with the stacked structure body.

[A12] The imaging element according to any one of [A01] to [A11], wherein a semiconductor substrate is formed of a silicon semiconductor substrate.

[B01] <<Imaging device>> An imaging device including imaging elements arranged in a two-dimensional matrix configuration and each including a light receiving element,
wherein at least part of the imaging elements arranged in a two-dimensional matrix configuration include a stacked structure body that is placed on a light incident side of the light receiving element and in which a semiconductor layer and a nanocarbon film to which a prescribed electric potential is applied are stacked from the light receiving element side, and
the semiconductor layer is made of a wide gap semiconductor with an electron affinity of 3.5 eV or more, or is made of a semiconductor with a band gap of 2.0 eV or more and an electron affinity of 3.5 eV or more.

REFERENCE SIGNS LIST $10_1$, $10_2$ imaging element
20 light receiving element (photoelectric conversion element, photosensor, or photodiode)
130, 230, 330 stacked structure body
131, 231, 331 semiconductor layer
132, $232n$, $232p$, 332, 332' nanocarbon film
33 tunnel insulating film
41 semiconductor substrate
42 protection film
43 transparent film (or color filter layer)
44 condensing lens (on-chip lens)
45 interlayer insulating layer
46 protection layer
$R_0$ red imaging element
$G_0$ green imaging element B₀ blue imaging element
IR₁ imaging element that receives infrared light

The invention claimed is:

1. An imaging element, comprising:
a light receiving element; and
a stacked structure body present on a light incident side of the light receiving element,
wherein the stacked structure body comprises semiconductor layer and a plurality of nanocarbon films,
wherein a first nanocarbon film of the plurality of nanocarbon films is doped with a first impurity of a first conductivity type, and a second nanocarbon film of the plurality of nanocarbon films is doped with a second impurity of a second conductivity type, and
wherein the semiconductor layer comprises one of:
a wide gap semiconductor with a first electron affinity of 3.5 eV or more, or
a semiconductor with a band gap of 2.0 eV or more and a second electron affinity of 3.5 eV or more.

2. The imaging element according to claim 1, wherein an electric potential, applied to at least one nanocarbon film of the plurality of nanocarbon films, is a negative potential with respect to a reference potential point of the light receiving element.

3. The imaging element according to claim 1, wherein the wide gap semiconductor is one of silicon carbide, cadmium sulfide, indium oxide, tin oxide, zinc oxide, titanium oxide, copper oxide, indium nitride, gallium nitride, tungsten oxide, gallium phosphide, magnesium oxide, or tantalum oxide.

4. The imaging element according to claim 1, wherein at least one nanocarbon film of the plurality of nanocarbon films comprises graphene.

5. The imaging element according to claim 1, wherein
the light receiving element is present in a semiconductor substrate, and
a tunnel insulating film is present on a surface of the semiconductor substrate,
wherein the surface of the semiconductor substrate is in contact with the stacked structure body.

6. The imaging element according to claim 1, wherein an electric potential is applied to a farthest nanocarbon film, of the plurality of nanocarbon films, from the light receiving element.

7. The imaging element according to claim 1, wherein the second conductivity type of the second impurity is different from the first conductivity type of the first impurity.

8. The imaging element according to claim 1,
wherein the first electron affinity of the wide gap semiconductor is 4.5 eV or less,
wherein the second electron affinity of the semiconductor is 4.5 eV or less.

9. The imaging element according to claim 1,
wherein the stacked structure body further comprises a plurality of the semiconductor layers,
wherein each semiconductor layer of the plurality of the semiconductor layers and each nanocarbon film of the plurality of nanocarbon films are alternately stacked, and
wherein an electric potential is applied to a farthest nanocarbon film, of the plurality of nanocarbon films, from the light receiving element.

10. The imaging element according to claim 9,
wherein the first electron affinity of the wide gap semiconductor is 4.5 eV or less,
wherein the second electron affinity of the semiconductor is 4.5 eV or less.

11. The imaging element according to claim 1,
wherein the imaging element is a back-side illumination imaging element,
wherein the light receiving element is present in a semiconductor substrate,
wherein a hole accumulation layer is present in a surface area of the semiconductor substrate, and
wherein the surface of the semiconductor substrate is in contact with the stacked structure body.

12. The imaging element according to claim 1, wherein a semiconductor substrate comprises a silicon semiconductor substrate.

13. An imaging device, comprising: a plurality of imaging elements arranged in a two-dimensional matrix configuration and each imaging element of the plurality of imaging elements including a light receiving element,
wherein at least one imaging element, of the plurality of imaging elements arranged in the two-dimensional matrix configuration, includes a stacked structure body present on a light incident side of the light receiving element,
wherein the stacked structure body comprises semiconductor layer and a plurality of nanocarbon films,
wherein a first nanocarbon film of the plurality of nanocarbon films is doped with a first impurity of a first conductivity type, and a second nanocarbon film of the plurality of nanocarbon films is doped with a second impurity of a second conductivity type, and
wherein the semiconductor layer comprises one of:
a wide gap semiconductor with a first electron affinity of 3.5 eV or more, or
a semiconductor with a band gap of 2.0 eV or more and a second electron affinity of 3.5 eV or more.

* * * * *